United States Patent
Goswami (10) Patent No.: US 8,748,273 B2
(45) Date of Patent: *Jun. 10, 2014

(54) SEMICONDUCTOR DEVICES INCLUDING DUAL GATE STRUCTURES AND METHODS OF FABRICATION

(75) Inventor: Jaydeb Goswami, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/524,693

(22) Filed: Jun. 15, 2012

(65) Prior Publication Data

US 2012/0256269 A1  Oct. 11, 2012

Related U.S. Application Data

(63) Continuation of application No. 12/348,737, filed on Jan. 5, 2009, now Pat. No. 8,207,582.

(51) Int. Cl.
*H01L 21/336* (2006.01)

(52) U.S. Cl.
USPC .......... 438/283; 438/157; 257/365; 257/407; 257/E21.623; 257/E21.637

(58) Field of Classification Search
USPC .......... 257/213, 250, 310, 407, 412, E29.275, 257/E29.421, E21.421, E21.623, E21.637; 438/157, 283
See application file for complete search history.

(56) References Cited

U.S. PATENT DOCUMENTS 6,458,695 B1 * 10/2002 Lin et al. ............... 438/659
6,902,969 B2  6/2005 Adetutu et al.
7,390,719 B2  6/2008 Jeon et al.
7,432,164 B2  10/2008 Adetutu et al.
2005/0054149 A1  3/2005 Xiang et al.
2005/0101145 A1 *  5/2005 Visokay et al. ............... 438/706

(Continued)

FOREIGN PATENT DOCUMENTS

TW  200720839 A  6/2007
WO  2007046772 A1  4/2007

OTHER PUBLICATIONS

International Search Report, International Application No. PCT/US2009/069705, mailed Jul. 27, 2010, three (3) pages.
Written Opinion of the International Searching Authority, International Application No. PCT/US2009/069705, mailed Jul. 27, 2010, four (4) pages.
Hussain et al., Metal Wet Etch Process Development for Dual Metal Gate CMOS, Electrochemical and Solid-State Letters, vol. 8, No. 12, pp. G333-G336 (2005).

(Continued)

*Primary Examiner* — Matthew Reames
*Assistant Examiner* — Farid Khan
(74) *Attorney, Agent, or Firm* — TraskBritt (57) ABSTRACT

Semiconductor devices including dual gate structures and methods of forming such semiconductor devices are disclosed. For example, semiconductor devices are disclosed that include a first gate stack that may include a first conductive gate structure formed from a first material, and a second gate stack that may include a dielectric structure formed from an oxide of the first material. For another example, methods including forming a high-K dielectric material layer over a semiconductor substrate, forming a first conductive material layer over the high-K dielectric material layer, oxidizing a portion of the first conductive material layer to convert the portion of the first conductive material layer to a dielectric material layer, and forming a second conductive material layer over both the conductive material layer and the dielectric material layer are also disclosed.

19 Claims, 3 Drawing Sheets

(56) References Cited

U.S. PATENT DOCUMENTS

| | | |
|---|---|---|
| 2005/0116217 A1 | 6/2005 | Jones et al. |
| 2006/0128157 A1 | 6/2006 | Lee et al. |
| 2006/0237796 A1 | 10/2006 | Cartier et al. |
| 2007/0034966 A1 | 2/2007 | Kim et al. |
| 2007/0082415 A1 | 4/2007 | Jeon et al. |
| 2007/0138563 A1 | 6/2007 | Callegari et al. |
| 2007/0178634 A1 | 8/2007 | Jung et al. |
| 2008/0099851 A1 | 5/2008 | Hsu et al. |
| 2008/0150036 A1 | 6/2008 | Jung et al. |
| 2008/0188044 A1 | 8/2008 | Hsu et al. |
| 2008/0224209 A1 | 9/2008 | Chun |
| 2010/0109095 A1* | 5/2010 | Li et al. .................. 257/392 |
| 2010/0171178 A1 | 7/2010 | Goswami |

OTHER PUBLICATIONS

Jung et al., Electrical Characteristics of an Ultrathin (1.6 nm) TaOxNy Gate Dielectric, Applied Physics Letters, vol. 76, No. 24, Jun. 12, 2000, pp. 3630-3631.

Park et al., Robust Ternary Metal Gate Electrodes for Dual Gate CMOS Devices, Electron Devices Meeting, IEDM Technical Digest, pp. 30.6.1-30.6.4 (2001).

Westlinder et al., Variable Work Functions in MOS Capacitors Utilizing Nitrogen-Controlled TiNx Gate Electrodes, Microelectronic Engineering, vol. 75, pp. 389-396 (Aug. 3, 2004).

Search Report for Taiwan Patent Application No. 098146468 dated Dec. 13, 2012, 1 page.

* cited by examiner

SEMICONDUCTOR DEVICES INCLUDING DUAL GATE STRUCTURES AND METHODS OF FABRICATION

CROSS-REFERENCE TO RELATED APPLICATION

This application is a continuation of U.S. patent application Ser. No. 12/348,737, filed Jan. 5, 2009, now U.S. Pat. No. 8,207,582, issued Jun. 26, 2012, the disclosure of which is hereby incorporated herein by this reference in its entirety.

FIELD

Embodiments of the present invention relate to semiconductor devices that include one or more dual gate structures and to methods of forming such semiconductor devices.

BACKGROUND

Semiconductor devices including dual gate structures that include dual metal electrodes, or gates, on high-K dielectrics are expected to be a basis for the next generation of memory devices. However, reliable manufacturing and integration of dual metal gates having two different work functions has been a challenge. For example, conventional methods of forming dual metal gates having two different work functions requires etching a metal layer over a portion of the high-K dielectric material before applying another metal layer, which may cause etch-induced damage to the high-K dielectric material.

For the reasons stated above and other reasons that will become apparent to those of ordinary skill in the art upon reading and understanding the present specification, there is a need in the art for improved semiconductor devices including dual gate structures and methods of forming such semiconductor devices.

BRIEF DESCRIPTION OF THE DRAWINGS

FIGS. 2 through 8 illustrate intermediate structures and embodiments of methods that may be used to form semiconductor devices including dual gate structures, such as shown in FIG. 1.

DETAILED DESCRIPTION

The illustrations presented herein are not meant to be actual views of any particular device or system, but are merely idealized representations that are employed to describe the present invention. Additionally, elements common between figures may retain the same numerical designation.

Figure 1:
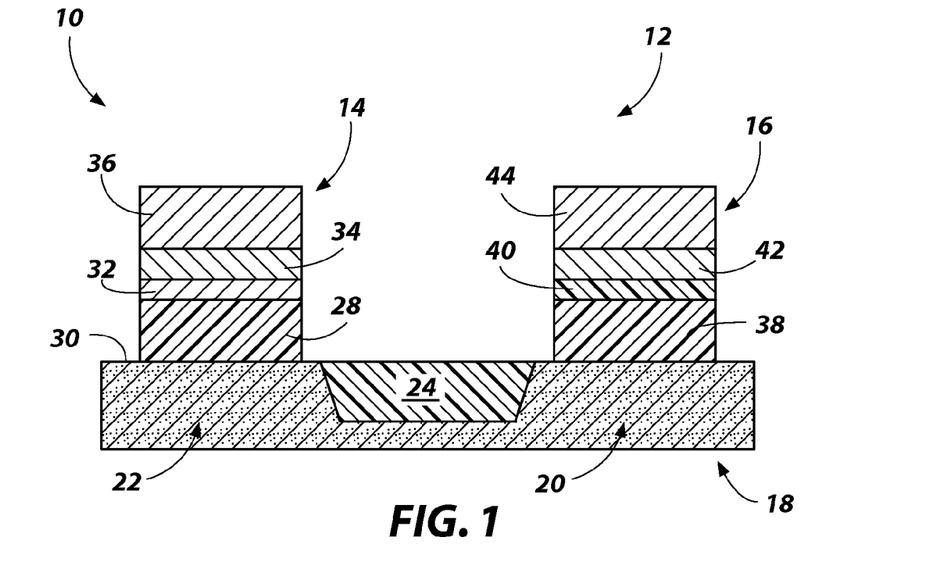
FIG. 1 is a partial cross-sectional view of a semiconductor device including dual gate structures.

FIG. 1 shows a partial cross-sectional view of a semiconductor device 10 including a dual gate structure 12 comprising a first gate stack 14 and a second gate stack 16. The dual gate structure 12 may be formed on a semiconductor substrate 18, and each gate stack 14 and 16 may include a plurality of stacked layers. The first gate stack 14 and the second gate stack 16 may comprise similar layers or may comprise layers having different material properties.

The semiconductor substrate 18 may include an n-type field effect transistor (nFET) device region 20 and a p-type field effect transistor (pFET) device region 22 separated by an isolation structure 24. For example, the isolation structure 24 may be a shallow trench isolation (STI) structure, which is well known in the art. Although the drawings illustrate only a portion of the semiconductor device 10, for clarity in describing semiconductor devices including dual gate structures, it may be understood that the semiconductor substrate 18 may include any number of such regions and that the semiconductor device 10 may include any number of such dual gate structures 12, as well as other structures. A gate structure may be positioned above each field effect transistor device region 20 and 22 of the semiconductor substrate 18. For example, and as shown in FIG. 1, the first gate stack 14 may be positioned over the pFET device region 22 and the second gate stack 16 may be positioned over the nFET device region 20.

The first gate stack 14 may comprise a plurality of stacked or layered structures, including a high-K dielectric structure 28, and a plurality of conductive material structures. The high-K dielectric structure 28 may be positioned adjacent an active surface 30 of the semiconductor substrate 18. For example, the high-K dielectric structure 28 may be positioned directly on the active surface 30 of the semiconductor substrate 18 and may be in direct contact with the semiconductor substrate 18. In additional embodiments, the high-K dielectric structure 28 may be formed on an oxidized silicon surface with an interfacial silicon oxide ($SiO_2$) layer having a thickness between about 3 angstroms (0.3 nm) and about 15 angstroms (1.5 nm). The high-K dielectric structure 28 may have a thickness between about 10 angstroms (1.0 nm) and about 50 angstroms (5.0 nm) and may comprise one of any number of high-K dielectric materials known in the art. As used herein, the term "high-K dielectric material" means a material with a high dielectric constant (K) as compared to silicon dioxide ($SiO_2$), for example, a high-K dielectric material may have a dielectric constant greater than about ten. For example, the high-K dielectric structure 28 may comprise a hafnium-based material, such as nitrided hafnium silicate (HfSiON), hafnium silicate ($HfSiO_4$), and/or hafnium dioxide ($HfO_2$). For another example, the high-K dielectric structure 28 may comprise a zirconium-based material, such as zirconium silicate ($ZrSiO_4$) and/or zirconium dioxide ($ZrO_2$).

The plurality of conductive material structures positioned over the high-K dielectric structure 28 of the first gate stack 14 may include a gate structure, such as a high work function gate structure 32 comprising a high work function conductive material. For example, the high work function conductive material may comprise at least one of a tantalum-based material, such as tantalum nitride (TaN), and a titanium-based material, such as titanium nitride (TiN). As used herein, the term "high work function conductive material" means a material having a work function greater than about 4.55 eV, for example, a high work function conductive material may be a conductive material having a work function of about 5.1 eV.

High work function conductive materials may be especially suited for use as gate structures associated with pFET device regions.

The high work function gate structure 32 may have a thickness of between about 5 angstroms (0.5 nm) and about 50 angstroms (5.0 nm) and may be positioned adjacent the high-K dielectric structure 28. For example, the high work function gate structure 32 may be about 20 angstroms (2.0 nm) thick and may be positioned directly on the high-K dielectric structure 28 and may be in direct contact with the high-K dielectric structure 28.

The plurality of conductive material structures of the first gate stack 14 may further include a conductive structure adjacent the gate structure, such as a low work function conductive structure 34 adjacent the high work function gate structure 32. For example, the low work function conductive structure 34 may be positioned directly on the high work function gate structure 32 and may be in direct contact with the high work function conductive material layer. As used herein, the term "low work function conductive material" means a material having a work function less than about 4.55 eV; for example, a low work function conductive material may be a conductive material having a work function of about 4.1 eV. For example, the low work function conductive material may comprise a tantalum silicon nitride (TaSiN) material. Low work function conductive materials may be especially suited for use as gate structures for nFET device regions, however, only the work function of the conductive material nearest the field effect transistor region of the semiconductor device may be of significant importance. For example, the most significant electrical field experienced by a field effect transistor (FET) may be the electrical field associated with the conductive layer closest to the FET. Accordingly, the high work function gate structure 32 may be positioned between the low work function conductive structure 34 and the high-K dielectric structure 28, and the high work function gate structure 32 may be positioned closer to the pFET device region 22 of the semiconductor substrate 18 than the low work function conductive structure 34. This configuration of the first gate stack 14 may be well-suited for use with the pFET device region 22.

In addition to the high work function gate structure 32 and the low work function conductive structure 34, the plurality of conductive material layers of the first gate stack 14 may further include a conductive word line structure 36. For example, the conductive word line structure 36 may comprise at least one of tungsten (W) and a metal silicide. The conductive word line structure 36 may be between about 200 angstroms (20 nm) and 1000 angstroms (100 nm) thick and may comprise a single material layer, or a plurality of material layers. For example, the conductive word line structure 36 may comprise a tungsten-, nickel-, cobalt- and/or titanium silicide-based material layer, a titanium-based contact material layer, such as titanium nitride (TiN), and a tungsten- and/or titanium-based barrier layer, such as titanium nitride (TiN) and/or tungsten nitride (WN).

The second gate stack 16 may comprise structures the same as, or similar to, those of the first gate stack 14 or may also comprise structures having different material properties than structures of the first gate stack 14. For example, the second gate stack 16 may be configured for use with the nFET device region 20 of the semiconductor substrate 18.

The second gate stack 16 may include a high-K dielectric structure 38 that may be substantially similar to the high-K dielectric structure 28 of the first gate stack 14. The high-K dielectric material layer may be positioned adjacent an active surface of the semiconductor substrate. For example, the high-K dielectric structure 38 may be positioned directly on the active surface 30 of the semiconductor substrate 18 and may be in direct contact with the semiconductor substrate 18. In additional embodiments, the high-K dielectric structure 28 may be formed on an oxidized silicon surface with an interfacial silicon oxide (SiO$_2$) layer having a thickness between about 3 angstroms (0.3 nm) and about 15 angstroms (1.5 nm). The high-K dielectric structure 38 of the second gate stack 16 may comprise the same material as the high-K dielectric structure 28 of the first gate stack 14, or a substantially similar material. For example, the high-K dielectric structure 38 may comprise a hafnium-based material, such as nitrided hafnium silicate (HfSiON), hafnium silicate (HfSiO$_4$), and/or hafnium dioxide (HfO$_2$). For another example, the high-K dielectric structure 38 may comprise a zirconium based material, such as zirconium silicate (ZrSiO$_4$) and/or zirconium dioxide (ZrO$_2$). The thickness of the high-K dielectric structure 38 may be between about 10 angstroms (1.0 nm) and about 50 angstroms (5.0 nm) similar to the high-K dielectric structure 28 of the first gate stack 14.

The second gate stack 16 may further comprise a converted dielectric structure 40 positioned adjacent the high-K dielectric structure 38. The converted dielectric structure 40 may comprise a dielectric material formed from converting a conductive material into a dielectric material, such as by forming a dielectric oxide of the conductive material. Accordingly, the same material that may form the gate structure of the first gate stack 14, such as the high work function conductive material of the high work function gate structure 32, may be converted to a dielectric material to form the converted dielectric structure 40 of the second gate stack 16. For example, the first gate stack 14 may comprise a high work function gate structure 32 formed from a high work function conductive material, such as tantalum nitride (TaN), and the converted dielectric structure 40 may be formed from a dielectric oxide of the high work function conductive material of the high work function gate structure 32, such as tantalum oxynitride (TaON). In another example, the first gate stack 14 may comprise a high work function gate structure 32 comprising titanium nitride (TiN) and the second gate stack 16 may comprise a converted dielectric structure 40 comprising titanium oxynitride (TiON), a dielectric oxide of the high work function conductive material of the high work function gate structure 32 of the first gate stack 14. The converted dielectric structure 40 of the second gate stack 16 may be formed from a converted material of the same material layer as the gate structure of the first gate stack 14 is formed. In view of this, the converted dielectric structure 40 of the second gate stack 16 may be substantially the same thickness as the gate structure of the first gate stack 14. For example, the converted dielectric structure 40 of the second gate stack 16 may be substantially the same thickness as the high work function gate structure 32 of the first gate stack 14. Accordingly, the thickness of the converted dielectric material layer may be between about 5 angstroms (0.5 nm) and about 50 angstroms (5.0 nm)—similar to the thickness of the high work function gate structure 32 of the first gate stack 14. For example, the converted dielectric structure 40 may be about 20 angstroms (2.0 nm) thick.

A plurality of conductive structures may be positioned over the converted dielectric structure 40 of the second gate stack 16, including a gate structure, such as a low work function gate structure 42 adjacent the converted dielectric structure 40. For example, the low work function gate structure 42 may be positioned directly on the converted dielectric structure 40 and may be in direct contact with the converted dielectric structure 40. The low work function gate structure 42 of the second gate stack 16 and the low work function conductive structure 34 of the first gate stack 14 may be formed from the same material layer. In view of this, the low work function gate structure 42 may be formed of the same material as the low work function conductive structure 34 of the first gate stack 14 and may be substantially the same thickness as the low work function conductive structure 34 of the first gate stack 14. The low work function gate structure 42 may be the closest conductive material of the second gate stack 16 to the nFET device region 20 of the semiconductor substrate 18, a configuration that may be well-suited for use with the nFET device region 20.

In addition to the low work function gate structure 42, the plurality of conductive structures of the second gate stack 16 may further include a conductive word line structure 44, similar to the conductive word line structure 36 of the first gate stack 14. For example, the conductive word line structure 44 may comprise at least one of tungsten (W) and a metal silicide. The conductive word line structure 44 may be between about 200 angstroms (20 nm) and 1000 angstroms (100 nm) thick and may comprise a single material layer, or a plurality of material layers. For example, the conductive word line structure 44 may comprise a tungsten-, nickel-, cobalt- and/or titanium silicide-based material layer, a titanium-based contact material layer, such as titanium nitride (TiN), and a tungsten- and/or titanium-based barrier layer, such as titanium nitride (TiN) and/or tungsten nitride (WN). The conductive word line structure 44 of the second gate stack 16 and the conductive word line structure 36 of the first gate stack 14 may be formed from the same material layer. Accordingly, the conductive word line structure 44 of the second gate stack 16 may comprise substantially the same material, and may be substantially the same thickness, as the conductive word line structure 36 of the first gate stack 14.

Embodiments of the semiconductor device 10 including the dual gate structures 12 described herein may comprise a first gate stack 14 having substantially the same height, or thickness, as a second gate stack 16. Additionally, each structure of the first gate stack 14 may correspond to a structure of the second gate stack 16 that may be substantially the same thickness as the corresponding structure. For example, the high-K dielectric structure 28 of the first gate stack 14 may be substantially the same thickness and may comprise substantially the same material as the high-K dielectric material structure 38 of the second gate stack 16. The gate structure of the first gate stack 14, for example, the high work function gate structure 32, may be substantially the same thickness as the converted dielectric structure 40 of the second gate stack 16. Additionally, the converted dielectric structure 40 of the second gate stack 16 may comprise a dielectric material converted from the conductive gate material (e.g., of the high work function gate structure 32) of the first gate stack 14. For example, the converted dielectric structure 40 of the second gate stack 16 may be a dielectric oxide of the conductive gate material (e.g., of the high work function gate structure 32) of the first gate stack 14. The conductive gate structure of the second gate stack 16 (e.g., the low work function gate structure 42, may be substantially the same thickness as a conductive structure (e.g., the low work function conductive structure 34) of the first gate stack 14 and may comprise substantially the same material as the corresponding conductive structure of the first gate stack 14. For example, the low work function gate structure 42 of the second gate stack 16 may be substantially the same thickness and may comprise substantially the same material as the low work function conductive structure 34 of the first gate stack 14. Finally, the conductive word line structure 36 of the first gate stack 14 may be substantially the same thickness and may comprise substantially the same material as the conductive word line structure 44 of the second gate stack 16.

In additional embodiments, the conductive gate structure of the first gate stack 14 may comprise a low work function conductive material, rather than the high work function conductive material of the high work function gate structure 32, and the converted dielectric structure 40 of the second gate stack 16 may comprise a dielectric material formed from a converted low work function conductive material. For example, the converted dielectric structure 40 of the second gate stack 16 may comprise a dielectric oxide of a low work function conductive material. Additionally, the first gate stack 14 may comprise a high work function conductive structure formed from a high work function conductive material positioned over the gate structure, rather than the low work function conductive structure 34. Similarly, the second gate stack 16 may comprise a high work function gate structure positioned over the converted dielectric structure 40, which may act as the conductive gate structure of the second gate stack 16, rather than the low work function gate structure 42. Accordingly, the first gate stack 14 may be positioned over the nFET device region 20 of the semiconductor substrate 18, rather than the pFET device region 22 as shown, and may be configured for use with the nFET device region 20. Further, the second gate stack 16 may be positioned over a pFET device region 22 of the semiconductor substrate 18 and may be configured for use with the pFET device region 22.

Methods and intermediate structures for forming semiconductor devices, such as described herein, are described with reference to FIGS. 2 through 8.

Figure 2:
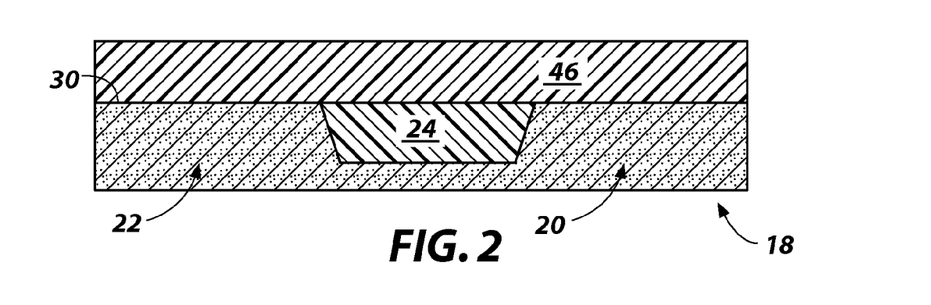
FIG. 2 is a partial cross-sectional view of an intermediate structure including a semiconductor substrate having a high-K dielectric material layer formed thereon.

As shown in FIG. 2, a semiconductor substrate 18 may be provided including an n-type field effect transistor (nFET) device region 20 and a p-type field effect transistor (pFET) device region 22 separated by an isolation structure 24. A high-K dielectric material layer 46 may be formed over the semiconductor substrate 18. For example, the high-K dielectric material layer 46 may be formed from a hafnium-based material deposited directly on the active surface 30 of the semiconductor substrate 18. In additional embodiments, the high-K dielectric material layer 46 may be formed from a hafnium-based material deposited on an oxidized silicon surface with an interfacial silicon oxide ($SiO_2$) layer having a thickness between about 3 angstroms (0.3 nm) and about 15 angstroms (1.5 nm). The high-K dielectric material layer 46 may be formed over the semiconductor substrate 18 by a variety of methods, including, but not limited to, atomic layer deposition (ALD), physical vapor deposition (PVD) and chemical vapor deposition (CVD). The high-K dielectric material layer 46 may be formed to a thickness between about 10 angstroms (1.0 nm) and about 50 angstroms (5.0 nm).

Figure 3:
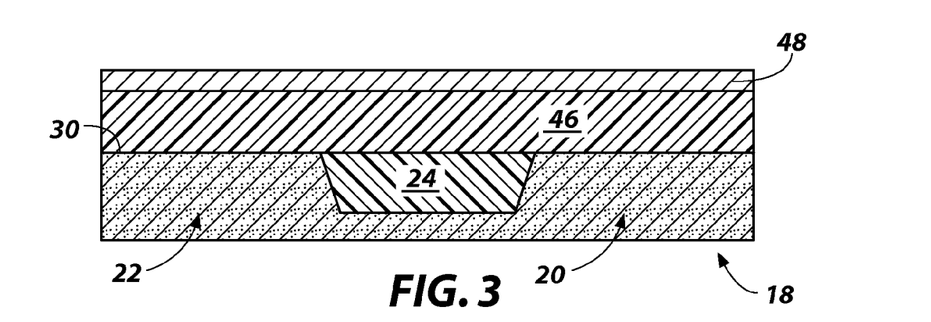
FIG. 3 is a partial cross-sectional view of the intermediate structure of FIG. 2 further including a first conductive material layer.

After the high-K dielectric material layer 46 is formed over the semiconductor substrate 18, a first conductive material layer 48 may be formed over the high-K dielectric material layer 46, as shown in FIG. 3. For example, a high work function conductive material layer may be formed directly on the high-K dielectric material layer 46. In additional embodiments, a low work function conductive material layer may be formed directly on the high-K dielectric material layer 46. The first conductive material layer 48 may be formed to a thickness in the range between about 5 angstroms (0.5 nm) and 50 angstroms (5.0 nm) by any of a variety of methods, including, but not limited to, atomic layer deposition (ALD), physical vapor deposition (PVD) and chemical vapor deposition (CVD). For example, a layer of tantalum nitride may be deposited directly onto the high-K dielectric material layer 46 to a thickness of about 20 angstroms (2.0 nm) by an ALD process.

Figure 4:
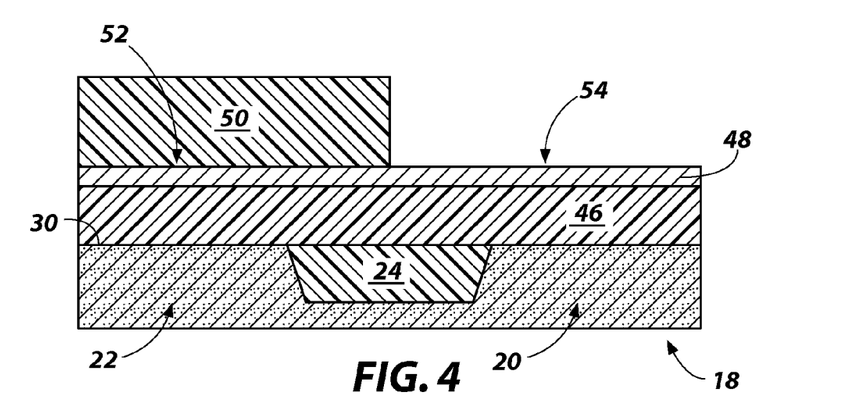
FIG. 4 is a partial cross-sectional view of the intermediate structure of FIG. 3 further including a masking structure.

After the first conductive material layer 48 is formed over the high-K dielectric material layer 46, a masking structure 50 may be formed over a portion of the first conductive material layer 48. For example, the masking structure 50 may be positioned over only one of the field effect transistor device regions 20 and 22, such as the pFET device region 22, as shown in FIG. 4. The masking structure 50 may be formed by depositing a masking material layer over the first conductive material layer 48 and then removing a selected portion of the masking material layer using known patterning techniques. For example, a polysilicon hard mask material layer may be deposited by CVD or PVD and then may be patterned by photolithography using a dry etch process. Accordingly, a portion of the first conductive material layer 48 may be covered by the masking structure 50, such as a portion 52 over the pFET device region 22 of the semiconductor substrate 18, and another portion of the first conductive material layer 48 may be exposed and substantially free of the masking material, such as an exposed portion 54 over the nFET device region 20 of the semiconductor substrate 18.

Figure 5:
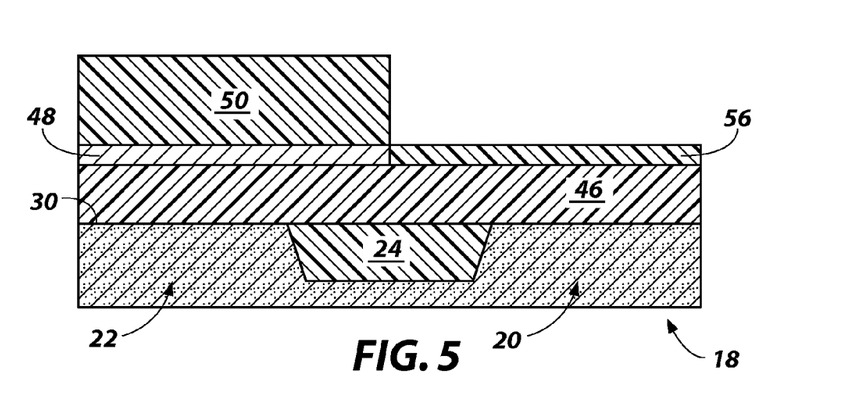
FIG. 5 is a partial cross-sectional view of the intermediate structure of FIG. 4 further including a portion of the first conductive material layer converted to a dielectric material layer.

As shown in FIG. 5, the exposed portion 54 (FIG. 4) of the first conductive material layer 48 may then be converted into a dielectric material layer 56. In some embodiments, the exposed portion 54 of the first conductive material layer 48 may be exposed to an oxidizing environment and the first conductive material layer 48 may be converted to a dielectric oxide. For example, the exposed portion 54 of the first conductive material layer 48 may be exposed to ozone at a temperature within the range of about 275° C. to about 350° C. for about ten minutes to about 30 minutes. Additional methods of oxidizing that may be used to convert conductive material to a dielectric oxide include, but are not limited to, in-situ steam generation (ISSG), plasma-based oxidation, exposure to nitric oxide (NO), and other oxidizing techniques that are known for uses such as oxidizing silicon (Si). In some embodiments, a high work function conductive material may be converted to a dielectric material. For example, a high work function conductive nitride material, such as tantalum nitride and/or titanium nitride, may be oxidized to convert the high work function conductive nitride material to a dielectric material, such as tantalum oxynitride and/or titanium oxynitride. In additional embodiments, a conductive titanium nitride material layer may be oxidized to convert the titanium nitride material to a dielectric titanium oxynitride material.

In yet additional embodiments, the first conductive material layer 48 may comprise a low work function conductive material layer that may be converted to a dielectric material, such as by oxidation. Examples of such low work function conductive materials that may be converted to a dielectric material, such as by oxidation, include, but are not limited to, TiSiN, which may be converted to dielectric TaSiON, HfN, which may be converted to dielectric HfON, ZrN, which may be converted to dielectric ZrON, Al, which may be converted to dielectric $Al_2O_3$, and Ti, which may be converted to dielectric $TiO_2$.

Figure 6:
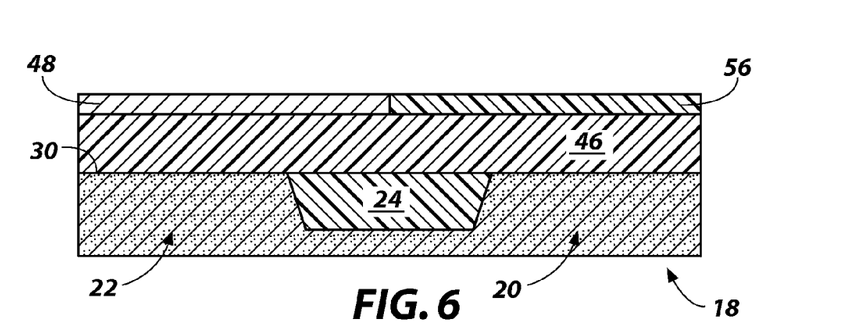
FIG. 6 is a partial cross-sectional view of the intermediate structure of FIG. 5 showing the masking structure removed.

After the exposed portion 54 of the first conductive material layer 48 has been converted into a dielectric material layer 56, the masking structure 50 may be removed, as shown in FIG. 6. Removing the masking structure 50 may comprise exposing the masking structure 50 to an etchant. The etchant may be a selective etchant that may react with the masking material of the masking structure 50 to etch away the masking structure 50 and may not substantially etch either the first conductive material layer 48 or the converted dielectric material layer 56. For example, hydrofluoric acid (HF) diluted with water ($H_2O$), such as about 100:1 ($H_2O$:HF), may be applied to the masking structure 50 followed by tetramethylammonium hydroxide (($CH_3)_4NOH$) (TMAH) diluted with water ($H_2O$), such as about 2.25% TMAH in $H_2O$, which may etch the masking structure 50, such as a polysilicon hard mask structure, but may not substantially etch the first conductive material layer 48, such as a tantalum nitride material layer, or the converted dielectric material layer 56, such as a tantalum oxynitride material layer.

Figure 7:
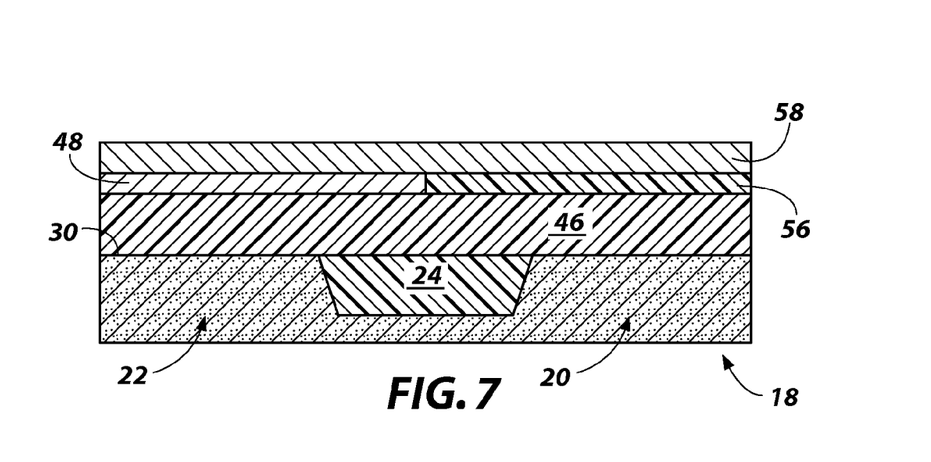
FIG. 7 is a partial cross-sectional view of the intermediate structure of FIG. 6 further including a second conductive material layer.

Next, a second conductive material layer 58 may be formed over the first conductive material layer 48 and the converted dielectric material layer 56, as shown in FIG. 7. The second conductive material layer 58 may be formed of a conductive material having a work function different than the first conductive material layer 48. For example, a second conductive material layer 58 having a low work function may be formed directly on the surface of the converted dielectric material layer 56 and the first conductive material layer 48, which may be formed of a material having a high work function. The second conductive material layer 58 may be formed to a thickness in the range between about 5 angstroms (0.5 nm) and 500 angstroms (50 nm) by any of a variety of methods, including, but not limited to, atomic layer deposition (ALD), physical vapor deposition (PVD) and chemical vapor deposition (CVD). For example, a second conductive material layer 58 of low work function material, such as (TaSiN), may be deposited directly onto the converted dielectric material layer 56, such as a (TaON) layer, and the first conductive material layer 48, such as a (TaN) layer, to a thickness of about 20 angstroms (2.0 nm) by an ALD process.

Figure 8:
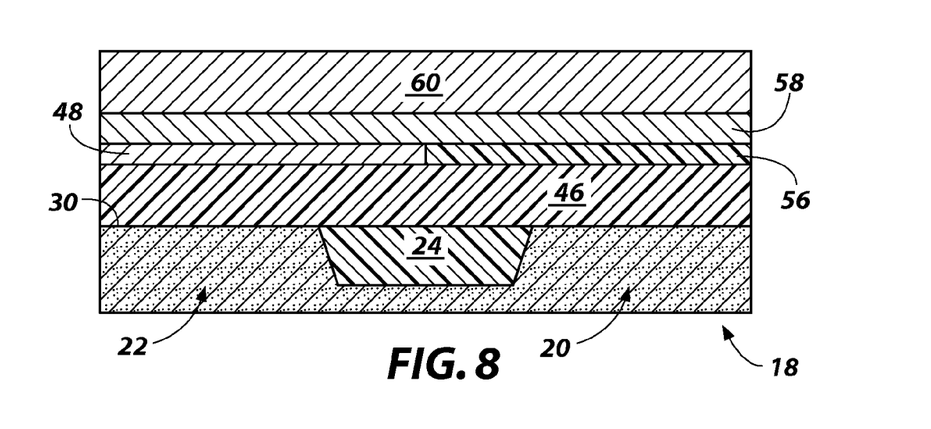
FIG. 8 is a partial cross-sectional view of the intermediate structure of FIG. 7 further including a conductive word line material layer.

Following the formation of the second conductive material layer 58, a conductive word line material layer 60 may be formed over the second conductive material layer 58, as shown in FIG. 8. The conductive word line material layer 60 may be formed to a thickness of about 200 angstroms (20.0 nm) to about 1000 angstroms (100.0 nm) and may be formed as a single material layer, or may be formed as a plurality of conductive material layers. In some embodiments, the conductive word line material layer 60 may comprise a layer which may comprise any one of tungsten (W), nickel (Ni), cobalt (Co), and titanium silicide. The conductive word line material layer 60 may additionally comprise a contact material layer, such as a titanium nitride (TiN) layer, and a barrier layer, such as tungsten nitride (WN) and/or a TiN layer. The conductive word line material layer 60 may be formed by any of a variety of methods including, but not limited to, atomic layer deposition (ALD), physical vapor deposition (PVD) and chemical vapor deposition (CVD).

Finally, the plurality of layers formed on the semiconductor substrate 18, including the high-K dielectric material layer 46, the first conductive material layer 48, the converted dielectric material layer 56, the second conductive material layer 58, and the conductive word line material layer 60, may be patterned, using methods known in the art, to form the first gate stack 14 and the second gate stack 16, as shown in FIG. 1. Accordingly, the high-K dielectric material layer 46 may be patterned to form the high-K dielectric structures 28 and 38, the first conductive material layer 48 may be patterned to form the high work function gate structure 32, the converted dielectric material layer 56 may be patterned to form the converted dielectric structure 40, the second conductive material layer 58 may be patterned to form the low work function conductive structure 34 and the low work function gate structure 42, and the conductive word line material layer 60 may be patterned to form the conductive word line structures 36 and 44. In additional embodiments, the high-K dielectric material layer 46 may not be patterned. In view of this, the high-K dielectric structures of the first and second gate stacks 14 and 16, respectively, may comprise a single continuous layer of high-K dielectric material, such as the high-K dielectric material layer 46, rather than the discrete high-K dielectric structures 28 and 38, respectively.

In some embodiments, the present invention includes semiconductor devices comprising at least one dual gate structure. The dual gate structure may include a first gate stack and a second gate stack. The first gate stack may include a first conductive gate structure formed from a first material, and the second gate stack may include a dielectric structure formed from an oxide of the first material. Furthermore, the dielectric structure may have a thickness substantially identical to the thickness of the conductive gate structure.

In additional embodiments, the present invention includes semiconductor devices comprising at least one dual gate structure comprising a first gate stack and a second gate stack, with each of the first and second gate stacks comprising a high-K dielectric material structure and a low work function conductive material structure. The first gate stack may include a high work function conductive material structure positioned between the high-K dielectric material structure and the low work function conductive material structure. Additionally, the second gate stack may include a dielectric structure comprising a dielectric oxide of the high work function conductive material of the high work function conductive material structure positioned between the high-K dielectric structure and the low work function conductive material structure.

In further embodiments, the present invention includes semiconductor devices comprising a semiconductor substrate including at least one semiconductor structure comprising an nFET device region and a pFET device region separated by an isolation structure. A first gate stack may be positioned over the pFET device region and include a first high-K dielectric structure, a low work function conductive structure and a high work function gate structure positioned between the low work function conductive structure and the first high-K dielectric structure. Additionally, a second gate stack may be positioned over the nFET device region and may include a second high-K dielectric structure, a low work function gate structure and a converted dielectric structure positioned between the low work function gate structure and the second high-K dielectric structure.

In additional embodiments, the present invention includes methods of forming a dual gate structure. The methods may include forming a high-K dielectric material layer over a semiconductor substrate, forming a first conductive material layer over the high-K dielectric material layer, oxidizing a portion of the first conductive material layer to convert the portion of the first conductive material layer to a dielectric material layer, and forming a second conductive material layer over both the conductive material layer and the dielectric material layer.

In yet further embodiments, the present invention includes methods of forming dual gate structures that may include forming a first conductive material layer over an nFET device region and a pFET device region of a semiconductor substrate and converting a portion of the first conductive material layer over only one of the nFET device region and the pFET device region to a dielectric material layer.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the scope of the invention as defined by the claims that follow, and their legal equivalents.

What is claimed is:

1. A method of forming a semiconductor device comprising a dual gate structure, the method comprising:
    forming a precursor structure, comprising:
        forming a conductive nitride material on an n-type field effect transistor (nFET) device region and a p-type field effect transistor (pFET) device region of a semiconductor substrate;
        forming a high-K dielectric material to be disposed between the conductive nitride material and the nFET device region and between the conductive nitride material and the pFET device region;
        converting to an oxide material a portion of the conductive nitride material disposed over the nFET device region to form a converted dielectric region over the nFET device region without converting to the oxide material another portion of the conductive nitride material disposed over the pFET device region;
        forming another conductive material on the oxide material and the another portion of the conductive nitride material, the another conductive material having a lower work function than a work function of the conductive nitride material; and
    patterning the precursor structure and forming
    a gate structure comprising:
        a dielectric region on the pFET device region, the dielectric region comprising the high-K dielectric material;
        a high work function region on the dielectric region comprising the conductive nitride material; and
        a low work function region on the high work function region comprising the another conductive material; and
    another gate structure comprising:
        another dielectric region on the nFET device region, the another dielectric region comprising the high-K dielectric material;
        a converted dielectric region on the another dielectric region comprising the oxide material, the oxide material being an oxide of the conductive nitride material; and
        another low work function region on the converted dielectric region comprising the another conductive material.

2. The method of claim 1, wherein converting to an oxide material a portion of the conductive nitride material comprises oxidizing the portion of the conductive nitride material.

3. The method of claim 1, wherein converting to an oxide material a portion of the conductive nitride material disposed over the nFET device region comprises exposing to an oxidizing environment the portion of the conductive nitride material without exposing to the oxidizing environment the another portion of the conductive nitride material.

4. A method of forming a dual gate structure, the method comprising:
    forming an isolating structure supported by a semiconductor substrate and isolating an n-type field effect transistor (nFET) device region of the semiconductor substrate from a p-type field effect transistor (pFET) device region of the semiconductor substrate;
    forming a dielectric material on the isolating structure, the nFET device region, and the pFET device region, the dielectric material comprising a high-K dielectric material;
    forming a conductive nitride material on the dielectric material;

exposing a region of the conductive nitride material overlying the isolating structure to an oxidizing environment while not exposing another region of the conductive nitride material overlying the isolating structure to the oxidizing environment to form a region of a converted dielectric material over the nFET device region and adjacent to the another region of the conductive nitride material, the another region of the conductive nitride material exhibiting a high work function;

forming another conductive material on the region of the converted dielectric material and the another region of the conductive nitride material, the another conductive material exhibiting a low work function; and exposing at least a portion of the isolating structure laterally disposed between at least a portion of the region of the converted dielectric material and at least a portion of the another region of the conductive nitride material.

5. The method of claim 4, wherein exposing at least a portion of the isolating structure comprises exposing at least a portion of the isolating structure and at least a portion of the nFET device region laterally disposed between at least the portion of the region of the converted dielectric material and at least the portion of the another region of the conductive nitride material.

6. The method of claim 4, wherein exposing at least a portion of the isolating structure comprises exposing at least a portion of the isolating structure and at least a portion of the pFET device region laterally disposed between at least the portion of the region of the converted dielectric material and at least the portion of the another region of the conductive nitride material.

7. The method of claim 4, wherein exposing at least a portion of the isolating structure comprises partially removing the region of the converted dielectric material to form the portion of the region of the converted dielectric material.

8. The method of claim 4, wherein exposing at least a portion of the isolating structure comprises partially removing the another region of the conductive nitride material to form the portion of the another region of the conductive nitride material.

9. The method of claim 4, wherein exposing at least a portion of the isolating structure comprises fully exposing a surface of the isolating structure laterally disposed between at least the portion of the region of the converted dielectric material and at least the portion of the another region of the conductive nitride material.

10. A semiconductor device, comprising:
a dual gate structure, comprising:
a semiconductor substrate comprising:
an n-type field effect transistor (nFET) device region; and
a p-type field effect transistor (pFET) device region;
a gate structure comprising:
a dielectric region on the pFET device region, the dielectric region comprising a high-K dielectric material;
a high work function region on the dielectric region comprising a conductive nitride material; and
a low work function region on the high work function region comprising another conductive material; and
another gate structure comprising:
another dielectric region on the nFET device region, the another dielectric region comprising the high-K dielectric material;
a converted dielectric region on the another dielectric region comprising an oxide of the conductive nitride material; and
another low work function region on the converted dielectric region comprising the another conductive material.

11. The semiconductor device of claim 10, wherein the high work function region has a thickness between about 0.5 nm and about 5 nm.

12. The semiconductor device of claim 11, wherein the converted dielectric region has a thickness substantially equal to the thickness of the high work function region.

13. The semiconductor device of claim 10, wherein:
the gate structure further comprises a conductive word line structure on the low work function region;
the another gate structure further comprises another conductive word line structure on the another low work function region; and
the conductive word line structure and the another conductive word line structure each comprise at least one of a tungsten-based material, a nickel-based material, a cobalt-based material, a titanium silicide-based material, a titanium-based contact material, a tungsten-based barrier material, and a titanium-based barrier material.

14. The semiconductor device of claim 10, wherein the nFET device region and the pFET device region are isolated from one another by an isolation structure.

15. The semiconductor device of claim 10, wherein the high-K dielectric material has a dielectric constant greater than about ten.

16. The method of claim 1, wherein forming a conductive nitride material comprises forming tantalum nitride or titanium nitride.

17. The method of claim 1, wherein forming a high-K dielectric material comprises forming a hafnium-based material or a zirconium-based material.

18. The method of claim 4, wherein exposing a region of the conductive nitride material overlying the isolating structure to an oxidizing environment comprises:
forming a masking material on the conductive nitride material;
removing a portion of the masking material to expose the region of the conductive nitride material; and
introducing the region of the conductive nitride material to the oxidizing environment.

19. The method of claim 18, wherein exposing a region of the conductive nitride material overlying the isolating structure to an oxidizing environment further comprises, after introducing the region of the conductive nitride material to the oxidizing environment, removing the masking material.

* * * * *